United States Patent
Yoshimura

(10) Patent No.: US 6,362,013 B1
(45) Date of Patent: Mar. 26, 2002

(54) SEMICONDUCTOR INSPECTION APPARATUS AND METHOD OF SPECIFYING ATTRIBUTES OF DIES ON WAFER IN SEMICONDUCTOR INSPECTION APPARATUS

(75) Inventor: Nobuhiko Yoshimura, Tokyo (JP)

(73) Assignee: Agilent Technologies, Inc., Loveland, CO (US)

( * ) Notice: Subject to any disclaimer, the term of this patent is extended or adjusted under 35 U.S.C. 154(b) by 0 days.

(21) Appl. No.: 09/557,846

(22) Filed: Apr. 26, 2000

(30) Foreign Application Priority Data

Apr. 28, 1999 (JP) .......................................... 11-121184

(51) Int. Cl.[7] .............................................. H01L 21/66
(52) U.S. Cl. ............................................. 438/14; 716/4
(58) Field of Search ......................... 438/17, 14; 716/4

(56) References Cited

U.S. PATENT DOCUMENTS

| | | | |
|---|---|---|---|
| 4,928,002 A | * | 5/1990 | Corley et al. |
| 5,355,320 A | * | 10/1994 | Erjavic et al. |
| 5,768,144 A | * | 6/1998 | Nagase |
| 5,838,951 A | * | 11/1998 | Song |
| 5,893,088 A | * | 4/1999 | Hendricks et al. |

FOREIGN PATENT DOCUMENTS

JP   11-163063   6/1999

OTHER PUBLICATIONS

Hewlett–Packard Co., User's Guide HP E3180A SPECS revision 2.20, pp. 85–87, (Mar. 1998).
Keithley Instruments, Inc., S600 Parametric Test System Engineering Manual, pp. 2.9–2.12, (Nov. 1997).

* cited by examiner

*Primary Examiner*—Charles Bowers
*Assistant Examiner*—Stephen W. Smoot

(57) ABSTRACT

The data of a plurality of attributes of dies on a semiconductor wafer under a parametric test can be managed in a unified manner, and edited and displayed on a real-time basis with one tool. A semiconductor inspection apparatus has a memory for expanding and storing attribute data of dies as data of at least three values for selecting and specifying attributes of dies on a wafer from a plurality of attributes, and a display controller for allowing an operator to select any of the attributes of dies within one displayed image, and reflecting selected attributes immediately as die characteristics in the displayed image. A method of specifying attributes of dies on a wafer in such a semiconductor inspection apparatus is also disclosed.

7 Claims, 7 Drawing Sheets

SEMICONDUCTOR INSPECTION APPARATUS AND METHOD OF SPECIFYING ATTRIBUTES OF DIES ON WAFER IN SEMICONDUCTOR INSPECTION APPARATUS

BACKGROUND OF THE INVENTION

1. Field of the Invention

The present invention relates to a semiconductor inspection apparatus and a method of specifying attributes of dies on a wafer with such a semiconductor inspection apparatus.

2. Description of the Related Art

In the process of fabricating semiconductor circuit devices, it is customary to electrically test and evaluate a wafer before the wafer is cut into chips. In a parametric test using TEGs (Test Element Groups), one or more dies in a central area of the wafer where the probability of occurrence of defective dies is small are tested. If the tested die or dies in the central area of the wafer have no problem, then in peripheral areas of the wafer where probability of occurrence of defective dies is higher more or all dies are tested.

One example of a semiconductor parametric tester for use in such a test will be described below with reference to FIG. 7 of the accompanying drawings. As shown in FIG. 7, a semiconductor parametric test system 1 comprises a tester 3 for supplying an electric signal to a wafer 2 being measured and for measuring an electric signal from the wafer 2, a prober 5 for removing a wafer 2 to be measured from a wafer lot 4 and bringing probes into contact with a certain die on the removed wafer 2, a computer 6A for controlling the tester 3 and the wafer prober 5 to process measured data, and a group of measuring programs 6B for operating the computer 6A. The measuring program group 6B has a test plan 7 comprising an information file concerning the wafer 2 and devices fabricated thereon, a measuring algorithm library 8 comprising a file defining a measuring algorithm, a core program 9 for such functions as initializing various parts and loading and executing the test plan 7 and the measuring algorithm library 8, and a limit file 10. The measuring program group 6B also includes a user interface program 9a for receiving information from and giving information to the operator via a display unit and a keyboard. Each of the test plan 7, the measuring algorithm library 8, and the limit file 10 has a fill-in-the-box builder for the user to generate a file easily.

The test plan 7 includes a wafer specification 7a for defining the names, positions, and other attributes of dies on a wafer, a die specification 7b for defining the names and positions of modules on dies, a prober specification 7c for defining connections between device pads on the prober card in the wafer prober 5 and pins of a switching matrix, and a test specification 7d for defining a measuring algorithm for use in a device test.

For establishing the test plan 7, data concerning an entire wafer such as of the index and dimensions of the wafer and attributes of individual dies on the wafer are specified in the step of the wafer specification 7a. Dies refer to a plurality of chip regions produced on a semiconductor wafer. In many cases, dies in a peripheral area of a wafer are not used in the actual fabrication of semiconductor circuit devices, and are specified as marker dies for identifying other dies. Depending on the dimensions of the wafer and dies, such marker dies need to be manually specified. In addition, various tests, e.g., a DC conduction test, need to be specified as one of the attributes of predetermined dies. If a certain test fails, then a preliminary die may be required to be designated as a die to be tested next.

A die normally comprises several modules that are put together into a single set. The configuration of modules within individual dies is specified as the die specification 7b. The prober specification 7c is specified depending on the type of a probe card used for dies. A test to be conducted finally is specified as a measuring algorithm which is referred to as the test specification 7d. When the above data are specified to complete the test plan 7, the test plan 7 is loaded by the core program 9, and an actual test is carried out.

The parametric tester conducts a test of electric characteristics on a plurality of chip regions (dies) on a semiconductor wafer according to a die sorting test process. In this test, the probe of the wafer prober is held in contact with the dies. In recent years, as the yield of dies increases, not all the dies are tested, but only selected dies are tested, and if the tested dies are not defective, then the wafer is sent to a next fabrication process for increased productivity. The dies to be tested are selected in advance. Since defective dies tend to occur in the peripheral area of a wafer, many dies to be tested are selected in the peripheral area of the wafer. Therefore, it is not customary to place dies to be tested at equal intervals over the entire wafer.

When selecting dies on a wafer for a test, it has heretofore been difficult to select those dies particularly in the peripheral area of the wafer because of lack of suitable markers especially if the number of dies is large. It has been the conventional practice to display coordinate values at given distances or plot colors or patterns instead of graduations for assisting in selecting dies to be tested. Since such plotted assistive marks are mechanically applied, they fail to provide a useful relationship between different die layouts on individual wafers at the time when various types of semiconductor devices are manufactured on one production line, and hence are not effective enough as markers for complex die layouts particularly in the peripheral area of wafers.

Positional information relative to markers used for specifying dies to be tested has heretofore been managed as data of attributes different from data directly required for tests, indicative of whether dies are to be selected or not. The positional information thus managed as separate data is separate from the data required for the test, resulting in the need for data for associating these data with each other, which make the data management complex. For editing the data of the different attributes, because the data are managed separately, it is necessary to clearly indicate data to be edited, display the data on a display screen, and then edit the data in question, and to edit the data using tools that are different for individual data attributes. Accordingly, it has been tedious and time-consuming to edit data of different attributes. For example, a mode for selecting a die that serves as a marker and a mode for specifying a die to be tested may be different from each other, and these modes have to be switched for selecting and specifying dies.

Different data are displayed in an overlapping fashion on the same display screen. For example, 1) a die to be tested actually, 2) a die that serves as a marker in an editing process, 3) an initial position where an electric connection is to be made to a die by a wafer prober, and 4) a cursor on a die being presently edited, are displayed in an overlapping manner. However, data are prepared for each purpose of attributes and they are handled in a multiple mode only when displayed, and need to be edited separately for different attributes. For example, if a die to be tested is specified after a die that serves as a marker in the editing process is specified, then these specified dies are simultaneously displayed, but it is necessary to switch between modes in order to specify dies of different types.

The need for switching between modes makes it difficult for an operator who is not skilled enough to recognize how the testing process is in progress. The failure to recognize the proper testing sequence tends to cause errors.

SUMMARY OF THE INVENTION

It is therefore an object of the present invention to provide a unified management of data required for a test and information needed for specifying a die to be tested, so that data of different kinds can be handled together.

The present invention provides a means for managing multi-valued data of plural attributes for a die on a wafer in a unified manner, and displaying the managed data as graphical data and text data. The present invention also provides a means for editing the multi-valued data on a real-time basis based on the displayed data. More specifically, a method according to the present invention converts a plurality of data concerning individual dies on a wafer into data of at least three values, records the data of at least three values, and manages, in a unified manner, different attributes of dies, e.g., attributes indicating that dies are not specified, dies are specified as dies to be tested, and dies are specified as preliminary dies. The method also allows specified data to be immediately displayed on a display screen while a die is being specified.

According to the present invention, there is provided a method of specifying attributes of dies on a wafer in a semiconductor inspection apparatus comprising the steps of managing attribute data of dies as data of at least three values in a unified manner for selecting and specifying attributes of dies on a wafer from a plurality of attributes, allowing an operator to select any of the attributes of dies within one displayed image, and immediately reflecting selected attributes as die characteristics in the displayed image.

According to the present invention, there is also provided a semiconductor inspection apparatus comprising memory means for expanding and storing attribute data of dies as data of at least three values for selecting and specifying attributes of dies on a wafer from a plurality of attributes, and display control means for allowing an operator to select any of the attributes of dies within one displayed image, and reflecting selected attributes immediately as die characteristics in the displayed image.

The present invention applies to dies which have at least two attributes. If there exist two attributes for dies, then three values are required to express those attributes. Specifically, three values for a die indicate that only attribute A is specified, only attribute B is specified, and both attributes A, B are not specified (if both attributes A, B are to be simultaneously specified, then a fourth value is required). One of these attributes can be selected in one displayed image without the need for switching between modes. This is made possible by handling attribute data as multi-valued data such as a piece of data having at least three possible values. A selected attribute is immediately reflected in the displayed image when the attribute, once specified, is displayed on the display screen without the need for switching between modes. The display screen is not limited to a CRT or liquid crystal display screen, but represents a general display screen capable of presenting data to the operator. Attributes include all characteristics that can be specified for individual dies, e.g., information as to a die to which no special attribute is given, a die to be tested, a marker die, and a preliminary die for a test, information as to types of tests, which groups dies belong to, and a sequence in which a probe goes through dies. However, attributes should not be limited to these items of information.

Since the method according to the present invention makes it possible to manage the data of a plurality of attributes of dies on a semiconductor wafer under a parametric test in a unified manner, and edit and display the data on a real-time basis with one tool. Therefore, an operator who is not highly skilled can easily and reliably specify attributes of dies, such as ones for testing.

Character data and graphical data are displayed simultaneously, and any manipulation of one of the character data and graphical data is reflected in the other data. Therefore, the operator can easily confirm the data. Particularly, character data are arranged in a display sequence in which a wafer prober goes through dies in a test run. When the character data are traced in the sequence, the sequence to go through the dies can be confirmed on the graphical data with the cursor. If data of three values are used, the user may use data of the third value as marker die data or preliminary die data for a die to be tested. Therefore, the values may be signified freely.

DESCRIPTION OF THE PREFERRED EMBODIMENTS

Figure 7:
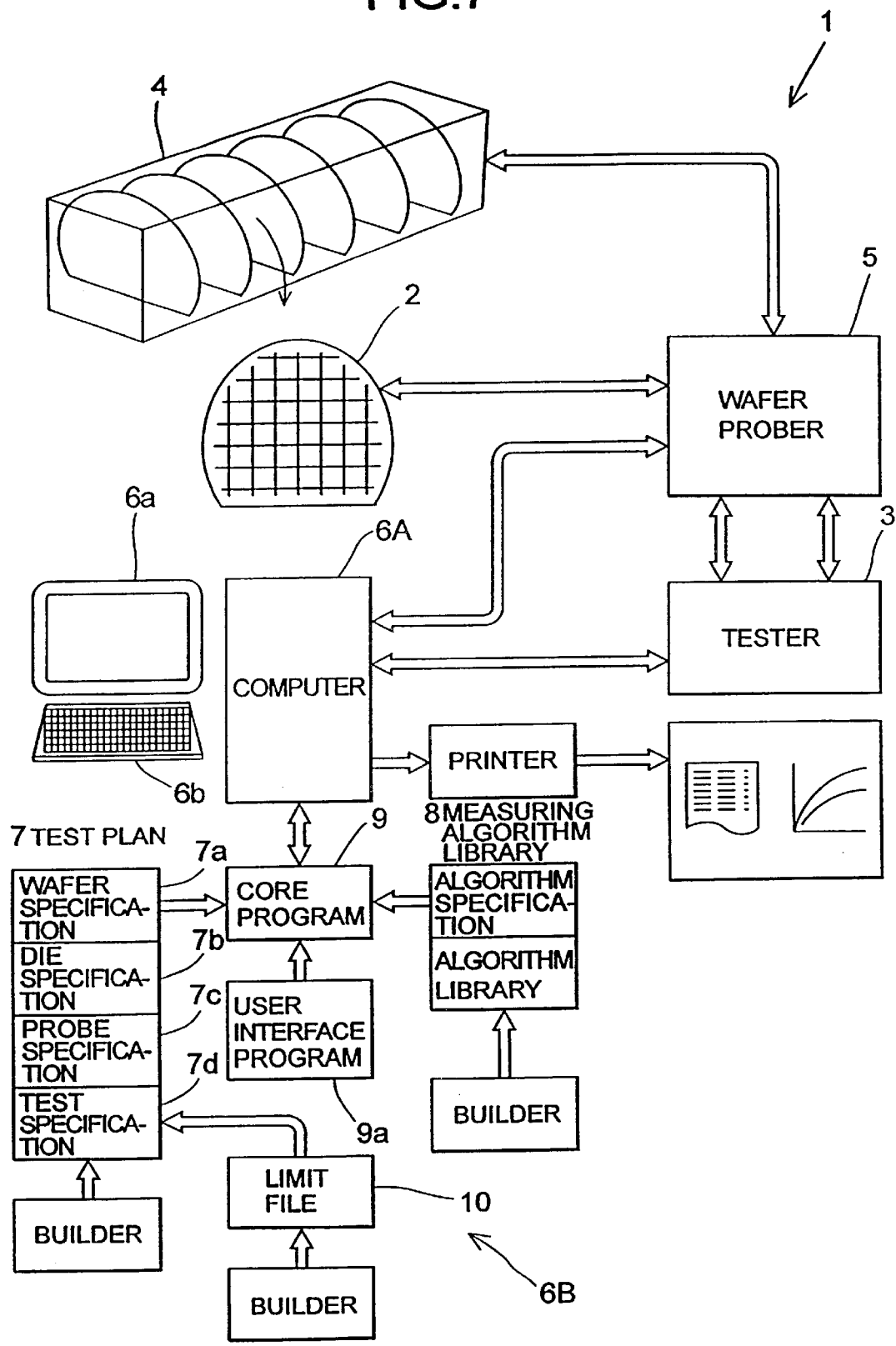
FIG. 7 is a block diagram of a semiconductor parametric tester to which the present invention is applicable.

The present invention is carried out by a set-up which comprises a computer 6A, a display monitor 6a, a keyboard 6b, and input/output units such as a mouse and a printer, as shown in FIG. 7. The computer 6A allows data to be exchanged between a tester 3 and a wafer prober 5.

Figure 1:
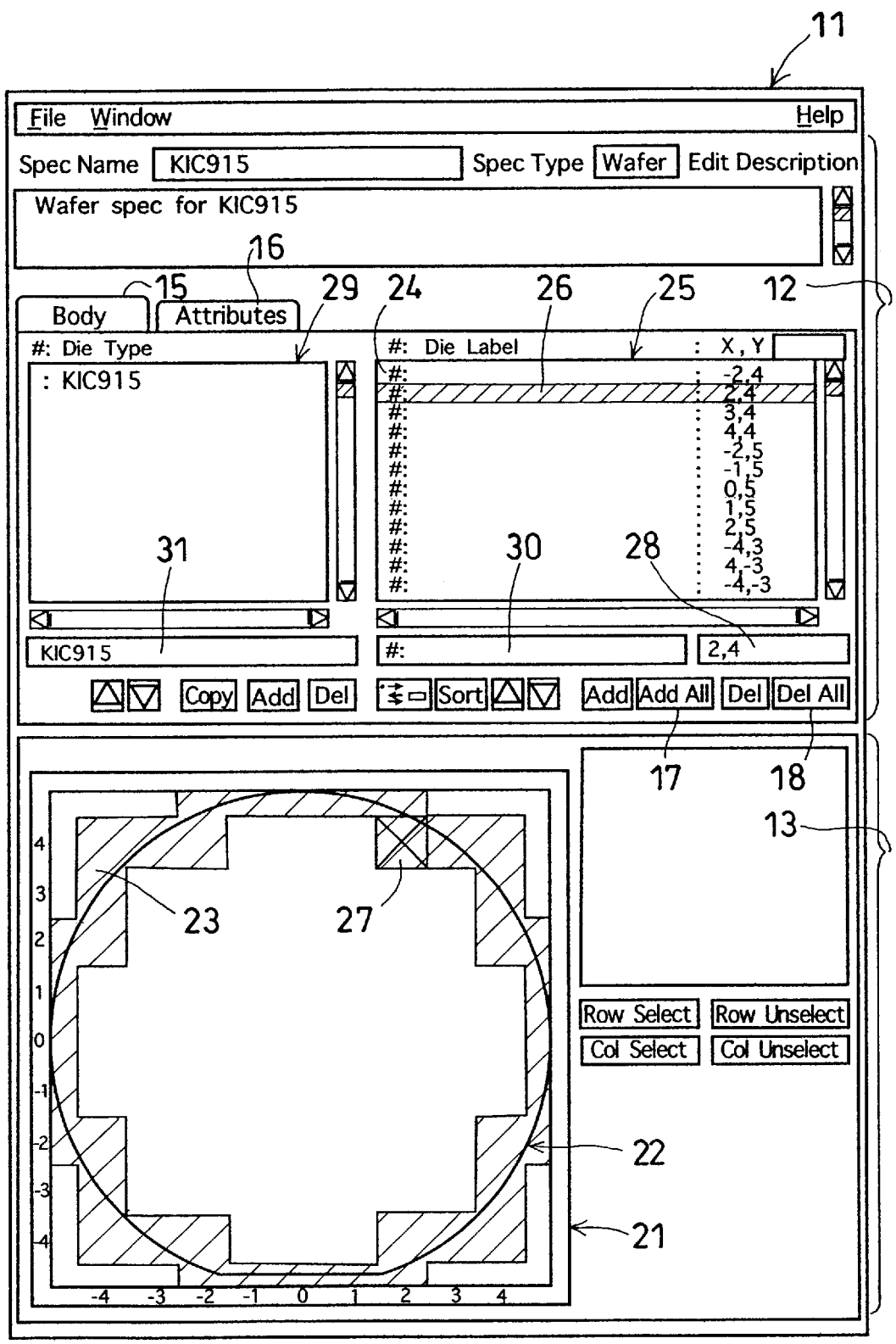
FIG. 1 is a view of an image displayed on a display screen, showing a marker die that is automatically specified, but not a die to be tested.

According to the present invention, the operator can perform a sequence of operation as follows: FIG. 1 shows an image displayed on a computer display screen 11 when an editing mode starts. The displayed image includes an image with a tab 15 "Body" for entering main data. The displayed image includes a character data display editor 12 in its upper area and a graphic data display editor 13 in its lower area. If wafer attributes such as vertical and horizontal dimensions of dies are entered in advance in an image with a tab 16 "Attributes", then a wafer display area 21 of the graphic data display editor 13 displays a background grid corresponding to the entered vertical and horizontal dimensions of dies. When the operator enters commands using a certain key on the keyboard in combination with "Add All" button 17 or "Del All" button 18, a mesh 23 is displayed over dies on a wafer 22 where four grid points are not entered, i.e., an area corresponding to a grid panel where even one grid point is outside of the wafer. On the grid, the position of a die is indicated by how many grids are traversed horizontally (along the x-axis) and vertically (along the y-axis) from a central die at an origin (0, 0). While rightward and upward directions are positive in FIG. 1, other directional settings are possible. At the same time, positions at grid coordinates of dies displayed in the mesh and symbols "#" 24 (indicating that the data are handled as commented data) indicating that the data are used only as markers are displayed in a die label display panel 25 in a right-hand area of the character data display editor 12. A cursor 26 in the die label display panel 25 and a cursor 27 in the wafer display area 21 positioned therebelow are movable in unison with each other for simultaneously indicating corresponding items of information. For example, as shown in FIG. 1, if the cursor 27 in the wafer display area 21 is located at a position (2, 4), the cursor 26 in the die label display panel 25 is also located at a position corresponding to a die at (2, 4). Simultaneously, a die position input area 28 displays "2, 4". When the operator changes the displayed "2, 4" in the die position input area 28 using the keyboard, the cursors 26, 27 jump to newly entered coordinates. The operator can enter information representing a particular die into a die label input area 30 using the keyboard. A die type display area 29 displays a die type, i.e., characters indicative of a die type entered in a die type input area 31.

Figure 2:
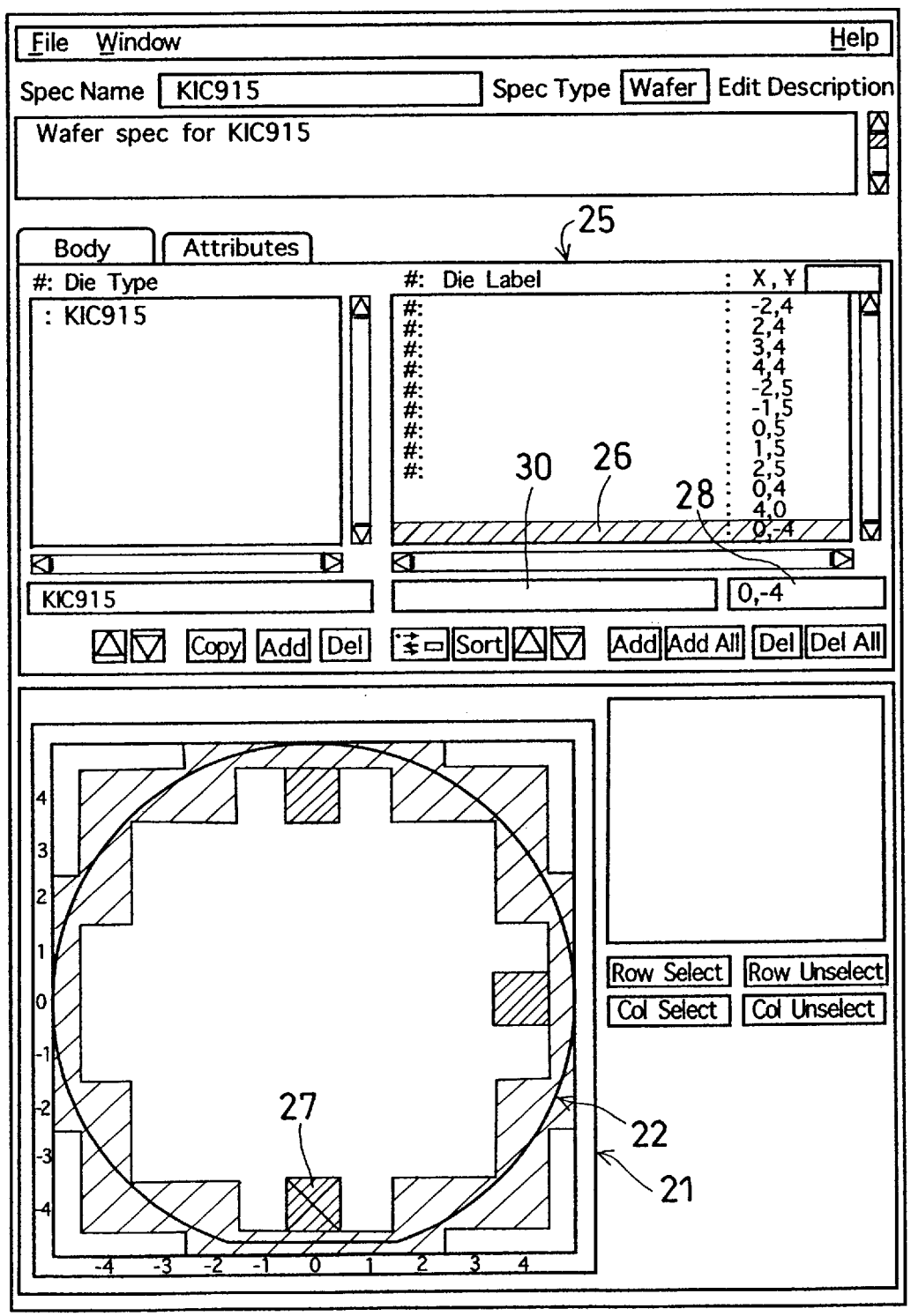
FIG. 2 is a view of an image displayed on the display screen, showing three dies specified as dies to be tested.

FIG. 2 shows three dies selected as dies to be tested in a displayed image. These three dies are dies (0, 4), (4, 0), (0, −4) indicated with hatched meshes on the wafer 22. The cursor 27 is positioned on the die (0, −4). In the die label display area 25, the cursor 26 is correspondingly positioned at "0, −4". It is to be noted that the three dies to be tested are not marked by "#" indicating a comment. In this manner, a die to be tested can be specified by clicking the mouse button on the die and then the cursor 27 moves to the die. Alternatively, a die to be tested can be specified by entering the position of the die in the die position input area 28 from the keyboard. The die thus specified is immediately reflected in the images in the wafer display area 21 and the die label display area 25.

Figure 3:
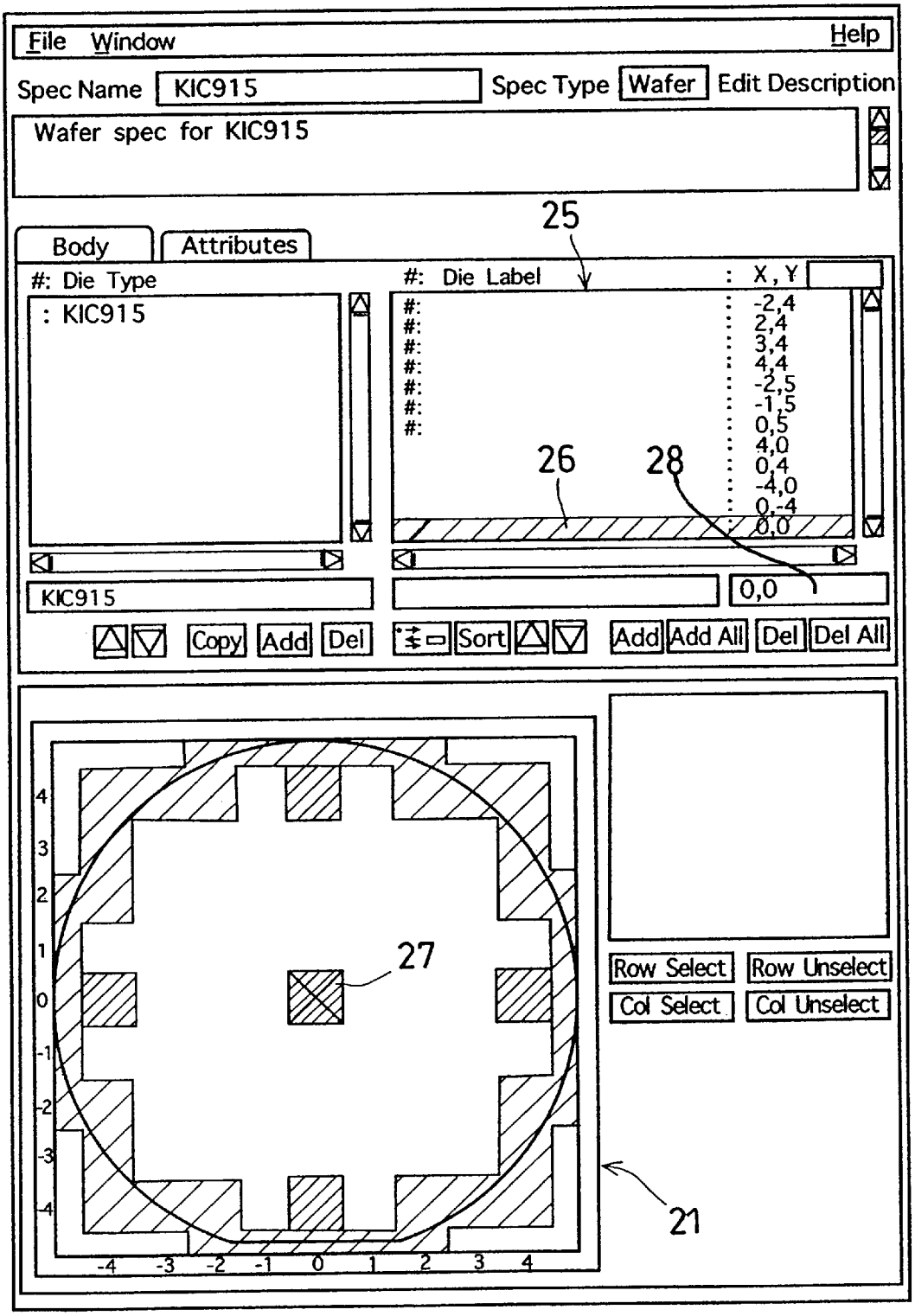
FIG. 3 is a view of an image displayed on the display screen, showing five dies specified as dies to be tested.

FIG. 3 shows five dies (−4, 0), (0, −4), (0, 4), (4, 0), (0, 0) selected to be tested. The dies to be tested are displayed as hatched. The die label display area 25 displays data relative to the five dies without the symbol "#". In the die label display area 25 and the wafer display area 21, the cursor 26 and the cursor 27 are positioned at "0, 0". The die position input area 28 displays the cursor position as coordinates (0, 0).

Figure 4:
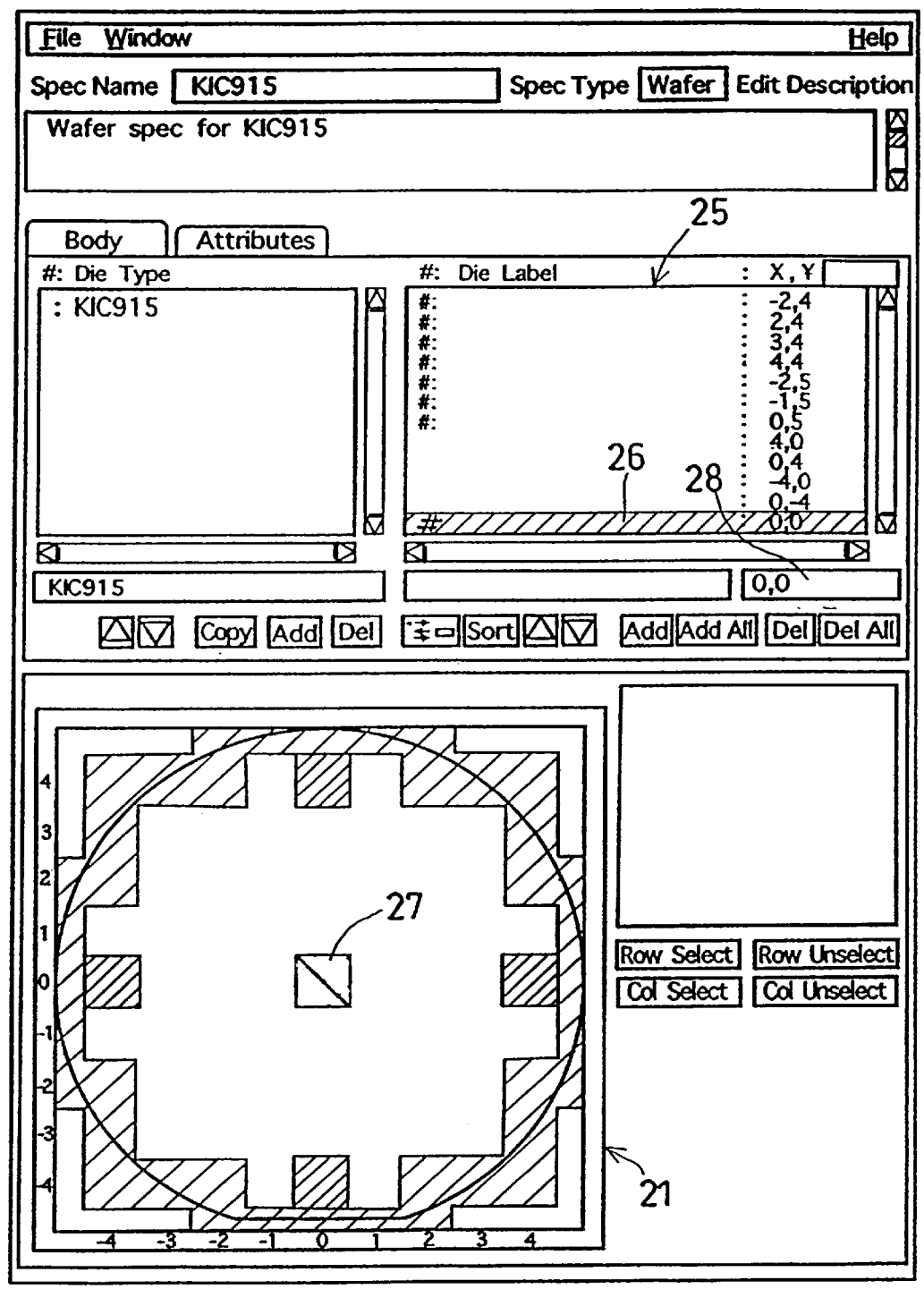
FIG. 4 is a view of an image displayed on the display screen, showing four dies specified as dies to be tested and a central die as a marker die.

FIG. 4 shows the five dies shown in FIG. 3, with the central die to be tested at the position (0, 0) being converted to a marker die by operating the mouse. At this time, the operator operates the mouse by clicking the mouse while pressing the shift key on the keyboard. If the operator operates the mouse and the keyboard once again in the same manner as described above, then the central die is converted back to a die to be tested. The marker die is displayed as not hatched. In the die label display area 25, the line pointed by the cursor 26 is marked with the symbol "#" indicating that the die is commented.

Figure 5:
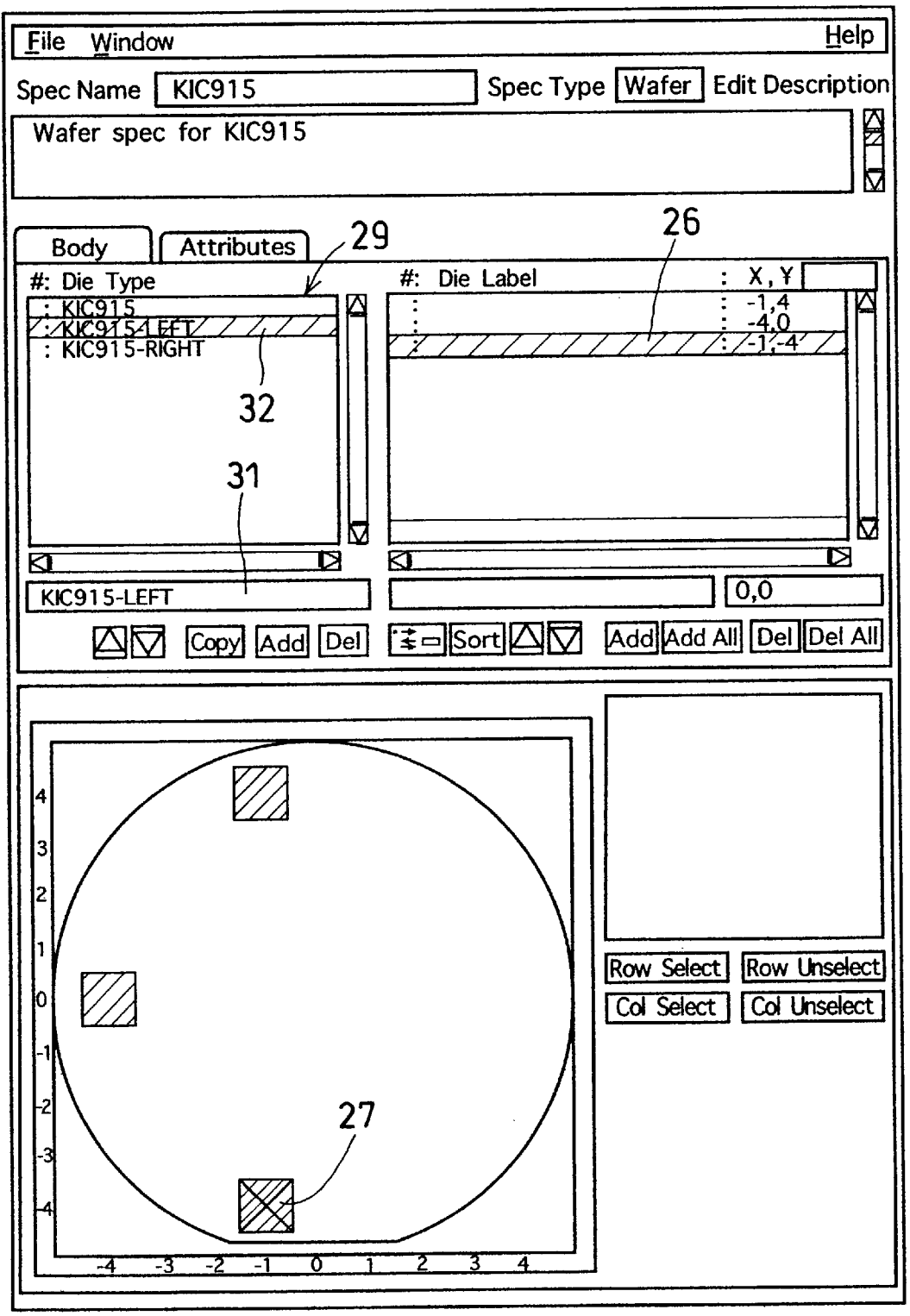
FIG. 5 is a view of an image displayed on the display screen, showing only dies contained in a specified group of dies.

FIG. 5 shows groups of dies named KIC915, and only dies (−1, 4), (−4, 0), (−1, −4) belonging to a left group KIC915_LEFT are displayed. No marker dies in the peripheral area of the wafer are displayed. Both the cursors 26, 27 point the die (−1, −4). In the die type display area 29, a cursor 32 points the group KIC915_LEFT. In the die type input area 31, the name of the group KIC915_LEFT is displayed. In this manner, dies can be grouped into groups with appropriate names. Groups of dies thus formed can easily be subject to different tests. For example, for burning in a wafer to test whether semiconductor circuit devices can withstand aging, dies of a certain group are burned in under certain conditions, and dies of another group are burned in under other conditions. Alternatively, dies of a certain group are subject to a DC conduction test, and dies of another group are burned in. The method according to the present invention is also effective to conduct different tests of other types on dies. Different sequences of tests can be assigned to respective groups of dies.

Figure 6:
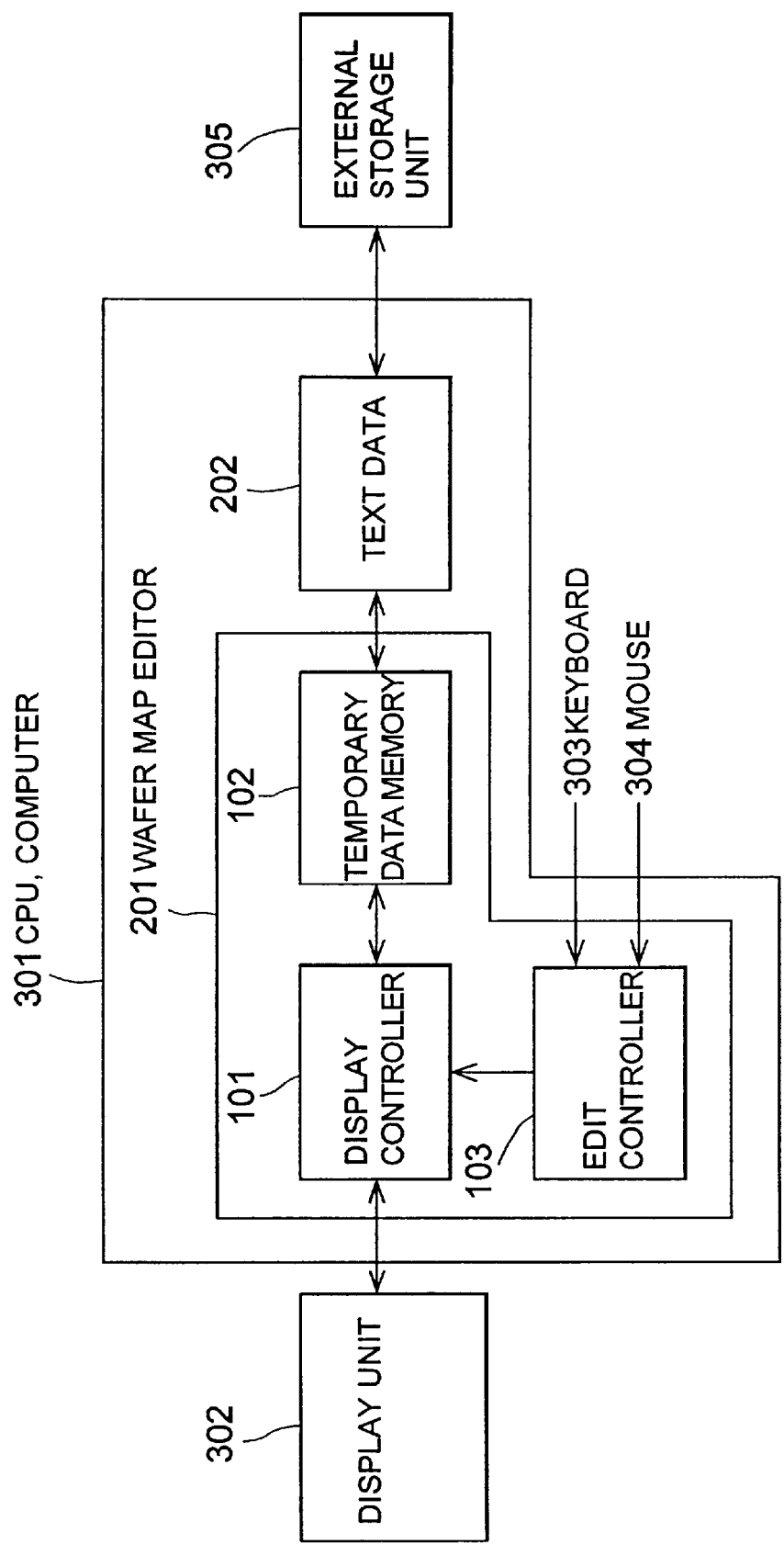
FIG. 6 is a block diagram showing a flow of data and control actions.

A flow of data for a standard editing process will be described below with reference to FIG. 6. Data 202 held as text data is expanded as data of at least three internal values in a working area (in a memory or a file) of a wafer map editor 201 in a computer 301. The expanded data is temporarily stored as temporary data in a temporary data memory 102.

A display controller 101 handles the temporary data in the temporary data memory 102 as graphical information and character information, and operates on the information. An edit controller 103 edits the information. Using a keyboard 303 or a pointing device 304 such as a mouse, the operator can edit the temporary data on a display unit 302 which is supplied with signals from the edit controller 103 through the display controller 101. The operator can edit both graphical and character images, and the edited results are immediately reflected in the image on the display unit 302.

The display controller 101, the temporary data memory 102, and the edit controller 103 which handle the graphical and character information are implemented by a single piece of software as the wafer map editor. The text data 202 shown in Table 1 below correspond to the temporary data. If necessary, the text data 202 is saved in an external data storage unit 305 or read therefrom into the wafer map editor 201.

Table 1 below shows the format of the text data 202 and an example of actual numerical values thereof. A data header begins with "Header", a die definition data section "Body" contains information as to dies to be edited according to the present invention, and a wafer attribute data section "Attributes" contains information as to the sizes of dies, etc. According to the conventional method, binary data indicative of whether a die is a marker die or not, and binary data indicative of whether a die is a die to be tested or not are managed separately from each other. According to the present invention, in the die definition data section, the attributes of dies are handled as data of at least three values, i.e., dies not specified, dies specified as marker dies, and dies to be tested. For example, if dies are to be tested by a normal DC conduction test and a burn-in test, then dies to be tested should be classified into those for the normal DC conduction test and those for the burn-in test. In this case, the attributes of dies are managed as data of four values. The attributes of dies may be managed as data of five values if dies can also be specified as preliminary dies. The attributes of dies may also be managed as data of six values. Attributes can be selected entirely freely, and the present invention is not limited to the illustrated attributes.

TABLE 1

[Header]

$Type: Wafer
$Name: KIC915
$Vers: 1
$Desc: Wafer spec for KIC915
$Date: 01/01/1999
$Time: 09:00:00
$User: specs

[Body]

| Die Name | X | Y | Die label | Comment |
|---|---|---|---|---|
| KIC915_A | 0 | 4 | | |
| KIC915_A | 0 | 0 | | |
| KIC915_A | −4 | 0 | | |
| KIC915_A | 0 | −4 | | |
| KIC915_A | 4 | 0 | | |
| #KIC915_A | 0 | 2 | | |
| #KIC915_A | 0 | −2 | | |
| #KIC915_A | 2 | 0 | | |
| #KIC915_A | −2 | 0 | | |
| #KIC915_A | −2 | 3 | | |
| #KIC915_A | −3 | 2 | | |
| #KIC915_A | 2 | 3 | | |
| #KIC915_A | 3 | 2 | | |
| #KIC915_A | 3 | −2 | | |
| #KIC915_A | 2 | −3 | | |
| #KIC915_A | −2 | −3 | | |
| #KIC915_A | −3 | −2 | | |
| KIC915_LEFT | −1 | 4 | | |
| KIC915_LEFT | −1 | −4 | | |
| KIC915_LEFT | −4 | 0 | | |
| KIC915_RIGHT | 4 | 0 | | |
| KIC915_RIGHT | 1 | −4 | | |
| KIC915_RIGHT | 1 | 4 | | |

[Attributes]

| Name | Type | Unit | Value | Comment |
|---|---|---|---|---|
| SIZE | REAL | mm | 200.000000 | |
| STEPX | REAL | um | 20000.000000 | |
| STEPY | REAL | um | 21000.000000 | |
| FLAT | INTEGER | deg | 180 | |
| ALIGNDIEX | INTEGER | | 1 | |
| ALIGNDIEY | INTEGER | | 1 | |
| ALIGNMODX | REAL | um | 1000.00000 | |
| ALIGNMODY | REAL | um | 1500.00000 | |
| CENTERDIEX | INTEGER | | 0 | |
| CENTERDIEY | INTEGER | | 0 | |
| OFFSETDIEX | REAL | | 0.000000 | |
| OFFSETDIEY | REAL | | 0.000000 | |
| COORDINATE | INTEGER | | 1 | |

In another embodiment, multi-valued data of dies may be displayed not only in different colors and patterns, but with character information, e.g., "T" for dies to be tested and "I" for marker dies, or may be displayed in a combination of these items of information. While the mouse as the pointing device and the keyboard are used to enter commands and data in editing the multi-valued data of dies in the above embodiment, it is also possible to enter flag data directly from only the keyboard or with only the pointing device. For example, numerical values, characters, and symbols may be displayed on the display screen, and may be clicked by the mouse. In this manner, the keyboard may be dispensed with. In the above embodiment, multi-valued data are handled as one item of text data. However, data that are held may be in the form of numerical data, or may be embedded as flags in other data rather than being handled independently as one item.

What is claimed is:

1. A method of specifying attributes of dies on a wafer in a semiconductor inspection apparatus comprising:

managing attribute data of dies as data of at least three values in a unified manner for selecting and specifying attributes of dies on a wafer from a plurality of attributes;

allowing an operator to select any of the attributes of dies within one displayed image; and reflecting selected attributes immediately as die characteristics in the displayed image.

2. A method according to claim 1, wherein said attributes are selected from a group consisting of a marker die, a die to be tested, and a die which is neither a marker die nor a die to be tested.

3. A method according to claim 1, wherein said attributes are selected from a group consisting of a marker die, a die to be tested, a die belonging to a group of dies, and a die which are neither a marker die nor a die to be tested nor a die belonging to the group of dies.

4. A method according to claim 1, wherein said attributes are selected using either only a keyboard or only a pointing device or a combination of a keyboard and a pointing device.

5. A semiconductor inspection apparatus comprising:

memory means for expanding and storing attribute data of dies as data of at least three values for selecting and specifying attributes of dies on a wafer from a plurality of attributes; and display control means for allowing an operator to select any of the attributes of dies within one displayed image, and reflecting selected attributes immediately as die characteristics in the displayed image.

6. A semiconductor inspection apparatus according to claim 5, wherein said attributes are selected from a group consisting of a marker die, a die to be tested, and a die which is neither a marker die nor a die to be tested.

7. A semiconductor inspection apparatus according to claim 5, wherein said attributes are selected from a group consisting of a marker die, a die to be tested, a die belonging to a group of dies, and a die which are neither a marker die nor a die to be tested nor a die belonging to the group of dies.

* * * * *